US007199048B2

(12) United States Patent
Chu et al.

(10) Patent No.: US 7,199,048 B2
(45) Date of Patent: Apr. 3, 2007

(54) METHOD FOR PREVENTING METALORGANIC PRECURSOR PENETRATION INTO POROUS DIELECTRICS

(75) Inventors: Karen Chu, Pleasanton, CA (US); Anil Vijayendran, San Jose, CA (US); Michal Danek, Cupertino, CA (US)

(73) Assignee: Novellus Systems, Inc., San Jose, CA (US)

( * ) Notice: Subject to any disclaimer, the term of this patent is extended or adjusted under 35 U.S.C. 154(b) by 0 days.

(21) Appl. No.: 10/897,479

(22) Filed: Jul. 23, 2004

(65) Prior Publication Data
US 2005/0148209 A1    Jul. 7, 2005

Related U.S. Application Data

(60) Provisional application No. 60/489,778, filed on Jul. 24, 2003.

(51) Int. Cl.
*H01L 21/4763* (2006.01)
(52) U.S. Cl. ............... 438/637; 438/638; 438/778; 438/798; 257/E21.577
(58) Field of Classification Search ............ 438/637, 438/778, 725, 798, 694, 474, 479; 257/632, 257/E21.577, E21.581, E21.273
See application file for complete search history.

(56) References Cited

U.S. PATENT DOCUMENTS

| 6,028,015 | A  | * | 2/2000  | Wang et al. ............ 438/789 |
| 6,114,259 | A  | * | 9/2000  | Sukharev et al. ........ 438/789 |
| 6,503,840 | B2 | * | 1/2003  | Catabay et al. ......... 438/694 |
| 6,537,896 | B1 | * | 3/2003  | Catabay et al. ......... 438/474 |
| 6,677,251 | B1 | * | 1/2004  | Lu et al. .............. 438/778 |
| 6,787,453 | B2 | * | 9/2004  | Abell ................. 438/637 |
| 6,846,756 | B2 | * | 1/2005  | Pan et al. ............ 438/798 |
| 6,913,995 | B2 | * | 7/2005  | Ko ................... 438/643 |
| 2003/0232510 | A1 | * | 12/2003 | Buchanan et al. ....... 438/778 |

\* cited by examiner

*Primary Examiner*—B. William Baumeister
*Assistant Examiner*—Igwe U. Anya
(74) *Attorney, Agent, or Firm*—Lathrop & Gage LC

(57) ABSTRACT

Methods and structures are provided for conformal lining of dual damascene structures in semiconductor devices that contain porous or low k dielectrics. Features, such as trenches and contact vias are formed in the dielectrics. The features are subjected to low-power plasma predeposition treatment to irregularities on the porous surfaces and/or reactively form an permeation barrier before a diffusion barrier material is deposited on the feature. The diffusion barrier may, for example, be deposited by CVD using metalorganic vapor reagents. The feature is then filled with copper metal and further processed to complete a dual damascene interconnect. The plasma predeposition treatment advantageously reduces the amount of permeation of the metalorganic reagent into the interlayer dielectric.

19 Claims, 14 Drawing Sheets

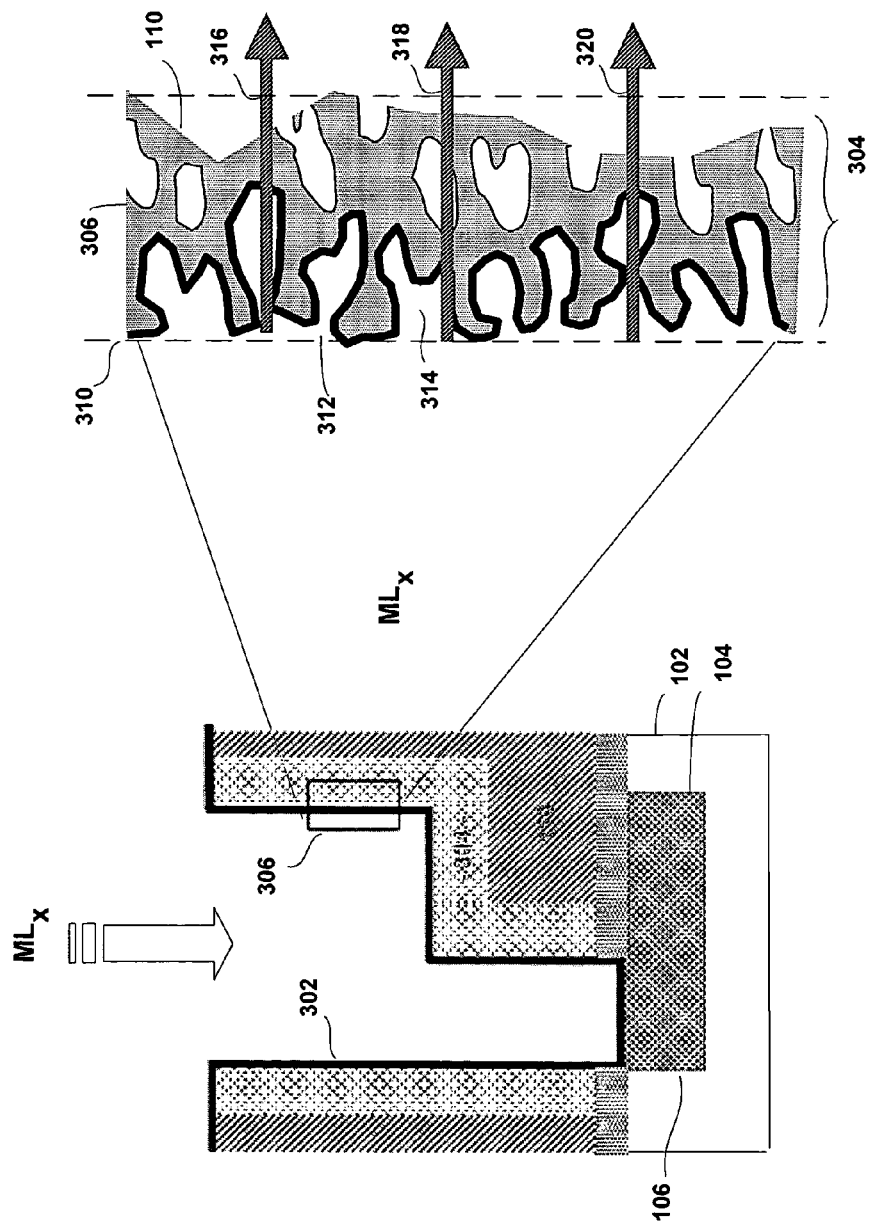

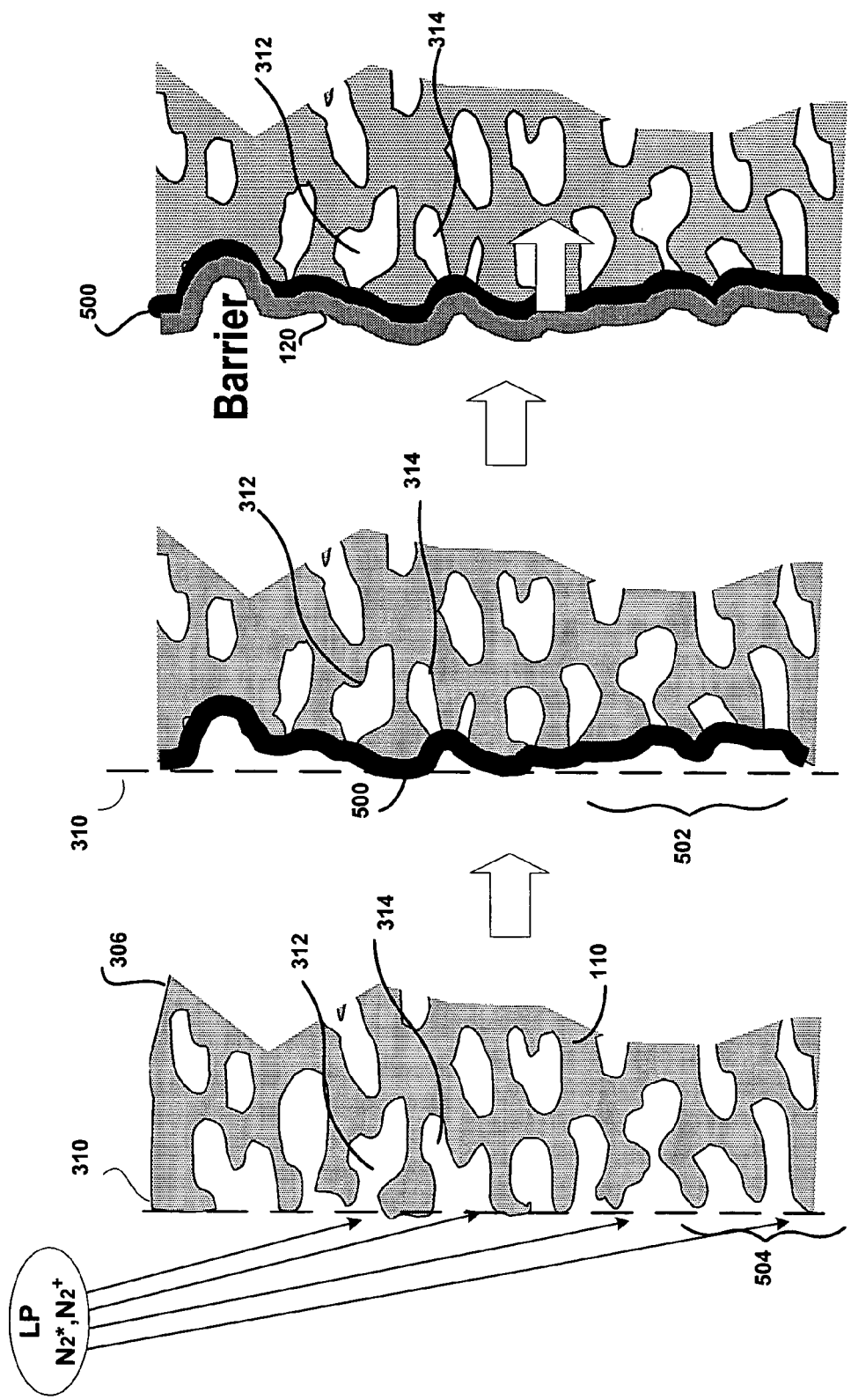

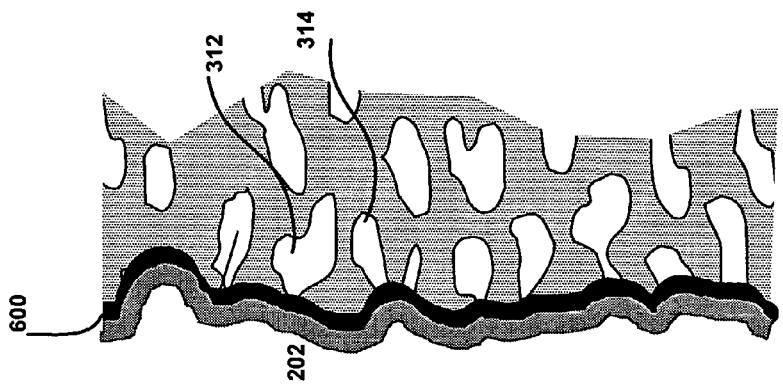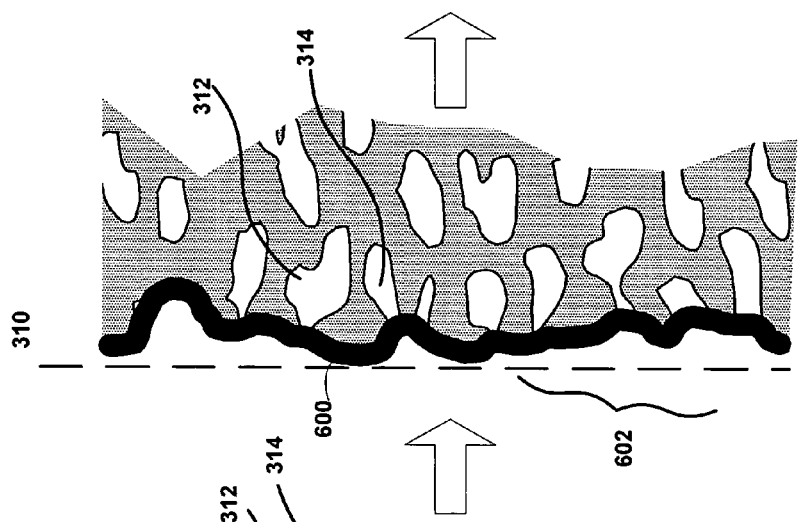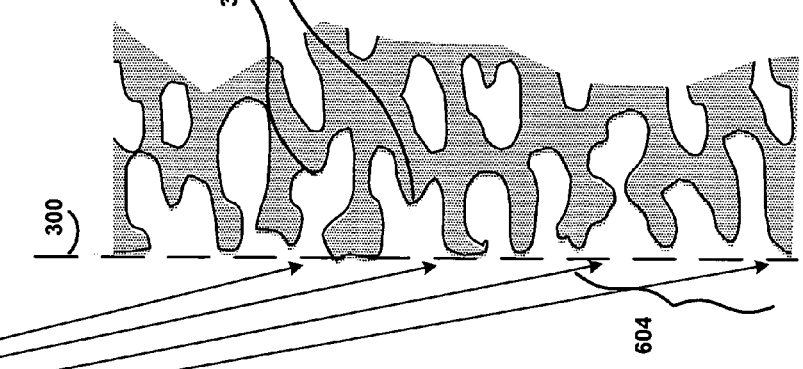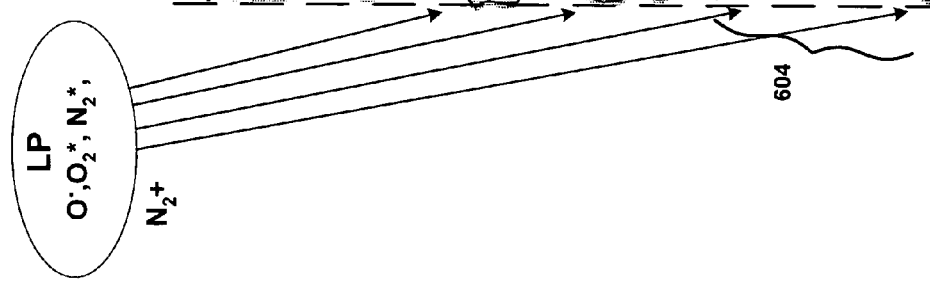
FIG. 6A  FIG. 6B  FIG. 6C

METHOD FOR PREVENTING METALORGANIC PRECURSOR PENETRATION INTO POROUS DIELECTRICS

CROSS-REFERENCE TO RELATED APPLICATIONS

This application claims priority to U.S. Provisional Application Ser. No. 60/489,778, filed Jul. 24, 2003, and incorporated herein by reference.

BACKGROUND

1. Field of the Invention

The invention relates to the field of semiconductor devices and, more particularly, materials and methods for interconnecting dual damascene copper wiring pathways with porous intermetal dielectrics.

2. Description of the Related Art

Semiconductor devices are made from multi-layer structures that are fabricated on semiconductor wafers. Dielectric materials are used to separate metallization interconnect lines. Three general techniques for fabricating metallization interconnect lines and conductive vias include: (i) a via first fabrication; (ii) self-aligned fabrication; and (iii) trench first fabrication. Damascene processing involves forming trenches in the pattern of the desired lines, overfilling the trenches with a metal or other conductive material, and then polishing the excess metal back to the insulating layer. Wires are thus left within the trenches, and may be isolated from or connected with one another in a desired connective pattern. The polishing process advantageously avoids the more difficult photolithographic mask and etching processes of conventional metal line definition. Typically, the interconnect metallization is a copper (Cu) material, and the conductive vias are also integrally formed of Cu.

FIGS. 1A through 1H are cross-sectional views illustrating various stages of a via-first dual damascene fabrication process. FIG. 1A shows a an interlayer dielectric stack deposition construct 100 where a first dielectric layer 102 has been etched to form a trench 104. that is filled with a copper line 106. A layer of etch-stop material 108 has been deposited atop the first dielectric layer 102 and the copper line 106. An interlayer dielectric material 110 covers the etch-stop material 108. By way of example, the first dielectric layer 102 and the interlayer dielectric material 108 may be fluorinated silicate glass (FSG) or carbon doped oxide (CDO). The copper line 106 is part of a horizontally extending metal line that operably connects with one or more integrated circuit functional elements, such as transistors (not shown). The etch stop material 108 may be a selective etch stop that additionally functions as a barrier material, such as silicon nitride (SiN) or silicon carbide (SiC).

The interlayer dielectric material 108 eventually is used to separate respective metallization layers, for example, to separate metal deposited at the level of copper line 106 from future materials to be deposited atop surface 112. In this context, it may be necessary or desirable to form a wiring interconnect extending from surface 112 to copper line 106. FIG. 1B illustrates a via 114 that has been etched for this purpose by the masked action (mask is not shown) of a first high power plasma $P_1$ through the interlayer dielectric material 110 down to the etch stop material 108. FIG. 1C shows the results of a second etching step by the action of a second high power plasma $P_2$, which forms a trench 116 in the interlayer dielectric material 110 (photoresist is not shown in the cross section). FIG. 1D illustrates the results of a third etching step by the action of a third high power plasma $P_3$, which removes the etch-stop material 108 in region 116 at the bottom of via 114.

It is common practice to line contact vias and trenches with a conductive diffusion barrier, for example, barrier 120 as shown in FIG. 1E. The barrier 120 may, for example, be Ta, TaN, TaN/Ta deposited by physical vapor deposition (PVD), alternating layer deposition (ALD) or chemical vapor deposition (CVD) processes. The formation of barrier 120 is followed by the application of a copper seed layer 122, for example, by a PVD process, as shown in FIG. 1F. Copper seed layer 122 is expanded by electrodeposition of copper mass 124, as shown in FIG. 1G. The copper mass 124 is polished, for example, by chemical mechanical polishing (CMP) to leave an exposed conductive surface 126. The numeral 128 generally designates a completed interconnect level formed as described above.

Barrier 120 is intended to prevent diffusion and drift of copper atoms and ions, respectively, from copper mass 124 into interlayer dielectric material 110, and to prevent diffusion of the interlayer dielectric material 110 into copper mass 124. This type of diffusion, if it occurs, may result in line-to-line leakage or to electrical break-down of the interlayer dielectric material 110. One pathway towards faster semiconductor devices involves the use of low-k dielectrics. Conventional dense silicon dioxide (oxide) has a dielectric or permittivity constant "k" of about 4, and low k dielectrics may be defined as those having k values less than that of dense oxide. Reducing k-values below about 2.5 to 3 is achieved by introducing porosity to lower the material density. By way of example, leading precursors used in forming low k dielectrics include the SiLK product from Dow Chemical and the methyl silsesquioxane-based LKD-5109 product from JSR Micro of Sunnyvale, Calif. The resulting low k films have reduced structural integrity resulting, in part, from the increased porosity. The porosity may, for example, range as high as 50% to 90% when using mesostructured liquid precursors to make these materials. The higher porosity films may not have sufficient structural integrity for use in semiconductor devices.

A variety of materials and techniques are being developed for producing low k films in integrated circuits. Deposition methods currently include spin-on deposition, CVD, plasma enhanced CVD (PECVD) and high density plasma (HDP) CVD, depending upon the characteristics desired. Some of the methods and films have been described by Laura Peters, "Pursuing the Perfect Low-k Dielectric" Semiconductor International, Vol. 21, No. 10 (September 1998), and the references cited therein. Some films have a k value from 3 to 3.5 such as hydrogen silsesquioxane (HSQ) and fluorinated oxides. Organic polymers, such as benzoncyclobutene (BCB) and polyarylene ethers (PAE), exhibit even lower k values between the 2.5 and 3 range. Other work with polytetrafluoroethylene (PTFE) using spin-on techniques has achieved intrinsic k values of about 1.9.

Integrating these new materials with existing technologies, however, introduces new challenges. Among other requirements, low k films must exhibit high chemical, thermal and mechanical stability in the face of disparate adjacent materials and exposure to a variety of processing environments. ILD materials should be compatible with etching, deposition, cleaning and polishing processes in order to integrate reliably with a manufacturing process. Integration of new materials and processes into established process flows is rarely a straightforward matter, as evidenced by past complications whenever new materials are introduced.

The porous nature of low k materials is problematic in advanced miniaturization. For integration reasons, pore size needs to be significantly smaller than the smallest printed feature, in order to minimize feature to feature variation. Despite the small pore dimensions (typically, <20A) subsequent layers deposited on these porous materials tend to enter the pores. In particular, deposition of the barrier layers by ALD or CVD results in permeation of the barrier layer precursors into the pores. This leads to degradation of the ILD properties and potentially to device breakdown (shorts).

It is not practical to address the permeation problems by PVD processes, e.g., sputtering as opposed to MLx vapor or liquid, in dual damascene processes where high aspect ratio features must be coated with barrier material. As used herein, the term "aspect ratio" means a ratio of depth or width to thickness. A trench 116, as shown in FIG. 1D, is generally regarded as one type of feature potentially having a high aspect ratio. As is illustrated in FIG. 2A, numerous irregularities form in barrier materials deposited by PVD onto high aspect ratio features having nanoscale dimensions. Surfaces 200, 202, 204 present themselves in a right-normal orientation to a depositional path 206 from the PVD source (PVDs) and, consequently, obtain relatively thicker deposits forming barrier 120 at these surfaces. Corner overhangs 208, 210 tend to build up at surface transitions, for example from vertical wall 212 to horizontal wall 214. These overhangs 208, 210, together with the increased likelihood that downwardly descending PVD materials on path 206 will contact the right-normal surfaces 200, 202, 204, produce a downward thinning of barrier 120 along vertical walls 212, 216. The material deposited on walls 212, 216 is also relatively rough in surface texture. Additionally, the thickness of barrier 120 at the surface 204 of via 114 is less than that deposited on surfaces 200, 202, owing to the depth of via 114. In like manner, the thickness of barrier 120 deposited on surface 218 may be thinner than that of barrier 120 on surfaces 200, 202. In summary, the effect of these variations is to require that excessive material must be deposited to form barrier 120 on some surfaces, in order to meet minimum thickness requirements on other surfaces. In some designs of particularly high aspect ratio, it may not even be possible to obtain minimum thicknesses by PVD on some surfaces, due to the volume occupied by material deposited on other surfaces, for example, if the corner overhangs 208, 210 accumulate sufficiently to restrict PVD access into trench 116.

FIG. 2B provides a comparison showing the advantages of CVD or ALD deposition processes using metal (M) organic ligand (L) MLx vapor to deposit barrier 120. Barrier 120 is substantially uniform on all surfaces of via 114 and trench 116, and the irregularities shown in FIG. 2A are absent.

FIG. 3 illustrates a permeation problem arising in context of forming the barrier 120 using MLx vapor, as depicted in FIG. 2B. The problem may be particularly acute when the interlayer dielectric material 110 is a porous or low k material. FIG. 3A shows a metalorganic precursor (MLx) being applied in vapor form to deposit barrier coating 302 as shown on surfaces that define via 114 and trench 116, where barrier coating 302 is a precursor to barrier 120. Because of the porous nature of the interlayer dielectric material 110, MLx penetrates into the trench and via sidewalls to forming a diffusion layer or zone 304. FIG. 3B is a square balloon diagram of region 306 from FIG. 3A illustrating additional detail with respect to the diffusion layer 304. The boundary of trench 114 is identified by a dashed line 310; however, the interlayer dielectric material 110 contains various pores, such as pores 312, 314. The pores 312, 314 are interconnected and provide permeation pathways 316, 318, 320, through which the MLx material may invade the interlayer dielectric material 110 to form the diffusion zone 304. Because MLx tends to decompose under the barrier deposition conditions, the inner surface of the dielectric in the diffusion zone 304 along permeation pathways 316, 318, 320 is coated with conductive or partially conductive material. This coating results in alteration of dielectric properties of interlayer dielectric material 110, with deleterious results affecting device performance and reliability.

While CVD and ALD deposition of conductive barrier materials is desirable for reasons comparatively illustrated in FIGS. 3A and 3B, the use of these processes on porous dielectrics is complicated by the deleterious effects of the permeation zone 304 illustrated in FIG. 3A. These processes alone do not provide a viable solution to preventing permeation.

One proposed solution to this problem is to fill the pores with another dielectric to block the precursor penetration. U.S. Patent Publication No. 2001/0054769, which is incorporated by reference herein, teaches the deposition of a 'protective layer' on a dielectric trench. The protective layer blocks pores in the trench, which may be used for dual-damascene wiring applications. For example, a sacrificial protective layer formed of an oxide/nitride/carbide cap is deposited onto a porous dielectric to prevent precursor diffusion by sealing the pores. While this technique largely mitigates the effects of precursor penetration into the dielectric during later deposition steps, depositing the intermediate or sacrificial oxide layer disadvantageously increases the k value of the dielectric, and requires many subsequent processing steps for the removal of the intermediate layer, namely from the via bottom, to maintain low interconnect resistance.

SUMMARY

A predeposition plasma treatment process addresses the problems outlined above and advances the art by preventing precursor permeation that, otherwise, would degrade the performance of porous low-k dielectrics. This advantage may be achieved without having to fill the pores by additionally depositing a pore blocking agent that must subsequently be removed.

In accord with the instrumentalities described herein, the surface of the porous or low k dielectric material may be altered with pore-sealing effect by exposing the surface to bombardment of plasma species under selected conditions. The plasma bombardment may, for example, result in localized material rearrangement by physical sputtering, as well as in chemical reactions, resulting in the reactive formation of a permeation barrier and/or densification and smoothing of the surface. The plasma chemistry may be selected such that the reactions between low k and plasma species result in formation of a material on the dielectric surface that can block the pores and provides adhesive underlayer for barrier deposition. In addition, the plasma chemistry can be selected to remove polymer and photoresist residues from the dielectric interface, for example, residues from prior etching processes. The plasma conditions are specially tuned to minimize damage within the bulk of the porous dielectric. In this respect, low power, low temperature, high density plasma is preferred. One predeposition plasma treatment begins with depositing a porous material on a substrate. A feature, such as a trench, contact or via is formed in the porous material by an etching process. The feature exposes surfaces presenting in-situ irregularities in the porous material. After the step of forming the feature, the feature is subjected to low power plasma exposure under conditions sufficient to chemically and physically modify the surface of the dielectric within the feature, effectively blocking the permeation of precursor during the subsequent barrier deposition step. The step of subjecting the feature to low power plasma exposure may include forming the plasma from a nitrogen-containing gas.

The plasma may be formed by subjecting an inlet gas mixture to inductively coupled RF power. A nitrogen-containing inlet gas mixture gas may advantageously contain additional constituents, such as argon, hydrogen, and/or oxygen. For example, argon may be present in an amount ranging from 5% to 55% of the inlet gas mixture volume, or in other amounts, with the balance being made up of nitrogen or other gases. Hydrogen or oxygen may be present in amounts ranging from 2% to 33% of the inlet gas mixture, or in other amounts. Alternatively, the plasma may be hydrogen-based or oxygen-based, either in combination with or to the exclusion of nitrogen.

The low power plasma may be defined as plasma having sufficient power to densify and chemically modify the surface of the porous dielectrics but without sufficient power to damage the feature beyond a predetermined amount, i.e., the low-power plasma does not cause the feature to exceed design tolerances. The low power plasma may, for example, be created by a conventional inductively coupled plasma source (ICP) using RF power less than 1000 W. Suitable pressures for these power settings are generally less than about 1 mTorr, and suitably from 0.1 to 0.7 mTorr, as required for a particular combination of plasma constituents. Suitable cycling rates may be, for example, from 100 kHz to 100 MHz, and are preferably about 400 kHz.

In one embodiment, the plasma is not intentionally biased towards the substrate to make the ion bombardment less energetic and so minimize dielectric damage.

BRIEF DESCRIPTION OF THE DRAWINGS

FIGS. 3A and 3B are cross sectional schematic views of a prior art problem showing permeation of barrier precursor material into a porous dielectric

FIG. 5A to 5C are cross-sectional schematic views of porous dielectric material treated with a nitrogen-based plasma;

FIGS. 6A to 6C are cross-sectional schematic views of porous dielectric material treated with a $N_2/O_2$-based plasma.

DETAILED DESCRIPTION

There will now be shown and described a predeposition treatment that may be used to form a permeation barrier.

Figure 1A:
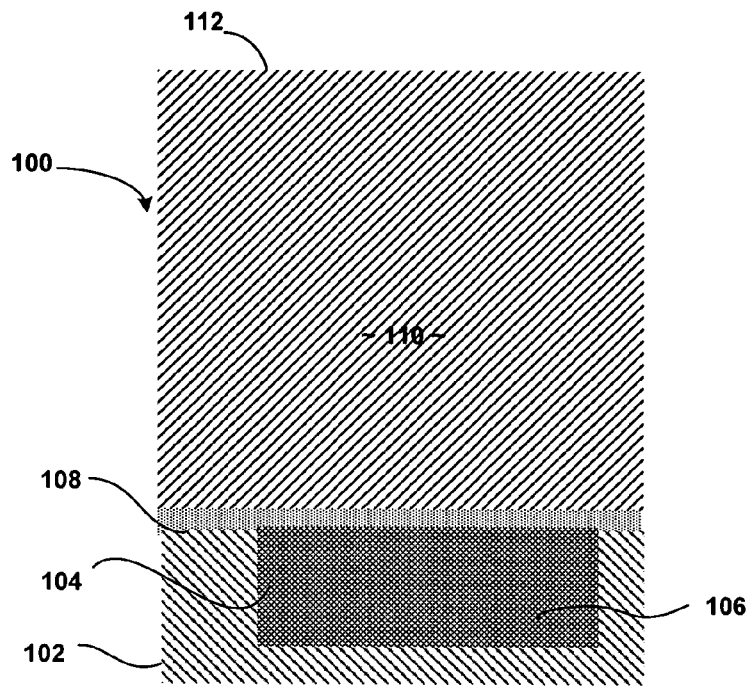
FIGS. 1A to 1H are cross sectional schematic views illustrating a workpiece sequentially as it undergoes a prior art copper dual damascene process flow.
Figure 1B:
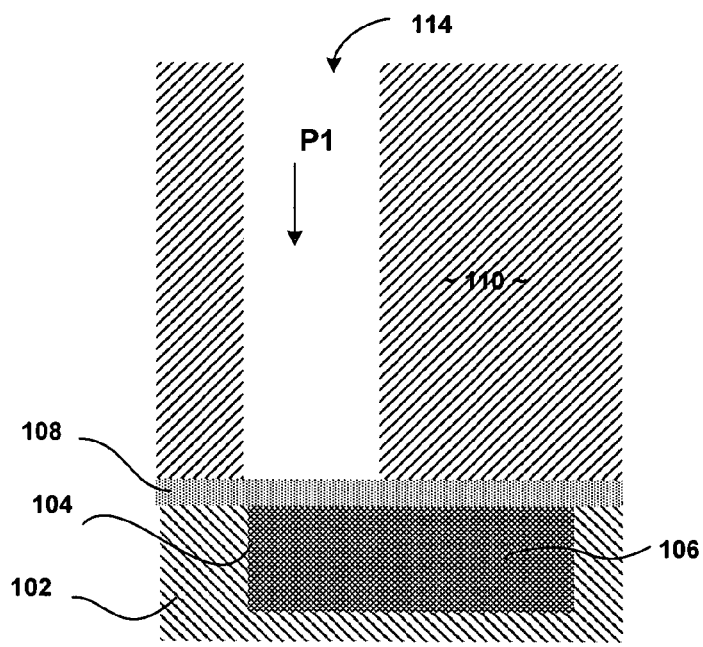
Figure 1C:
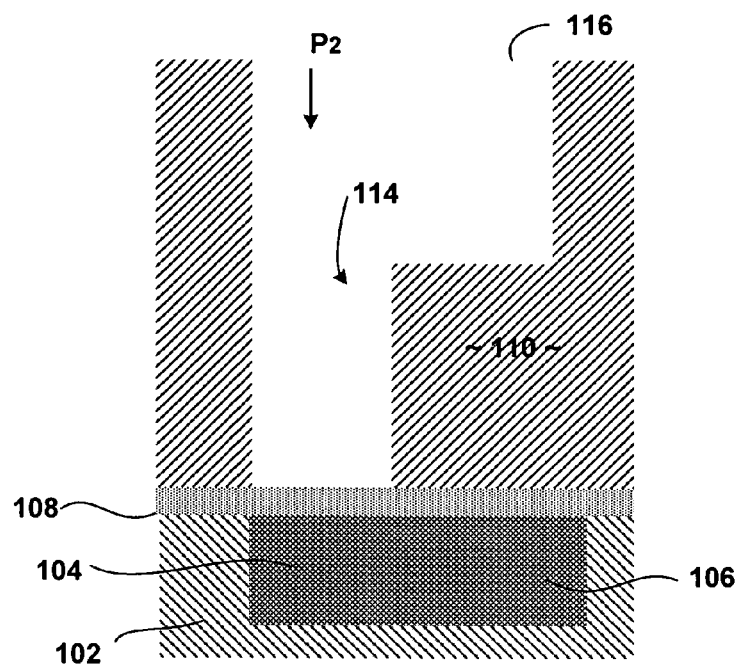
Figure 1D:
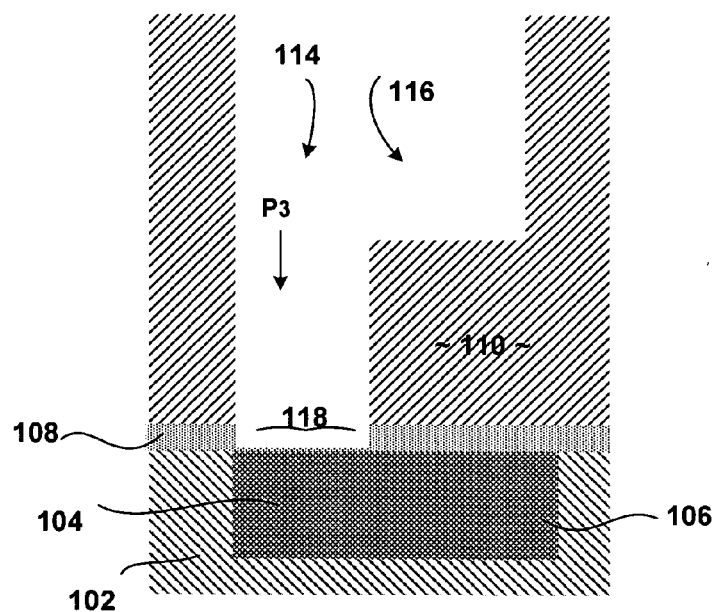
Figure 1E:
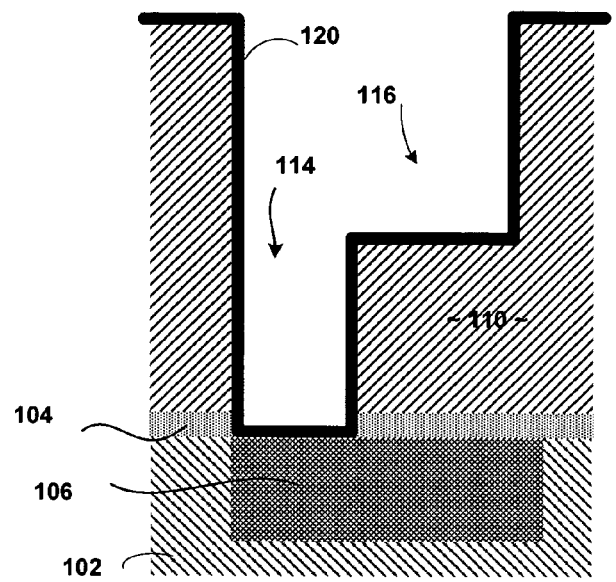
Figure 1F:
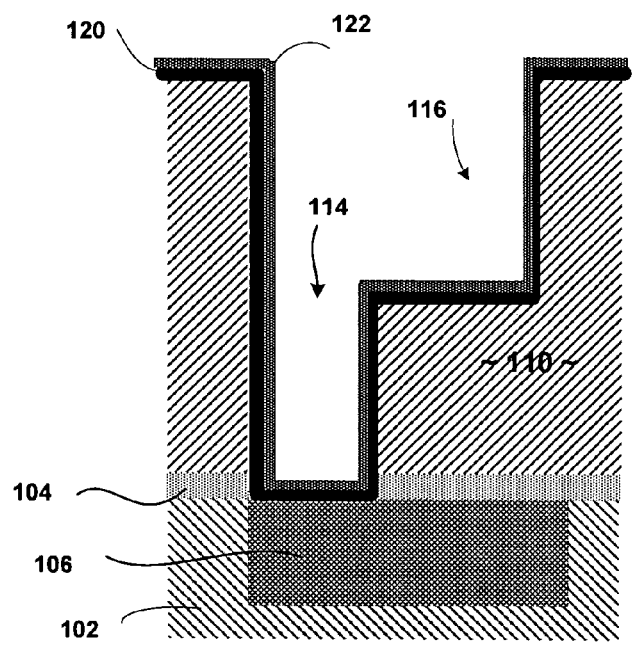
Figure 1G:
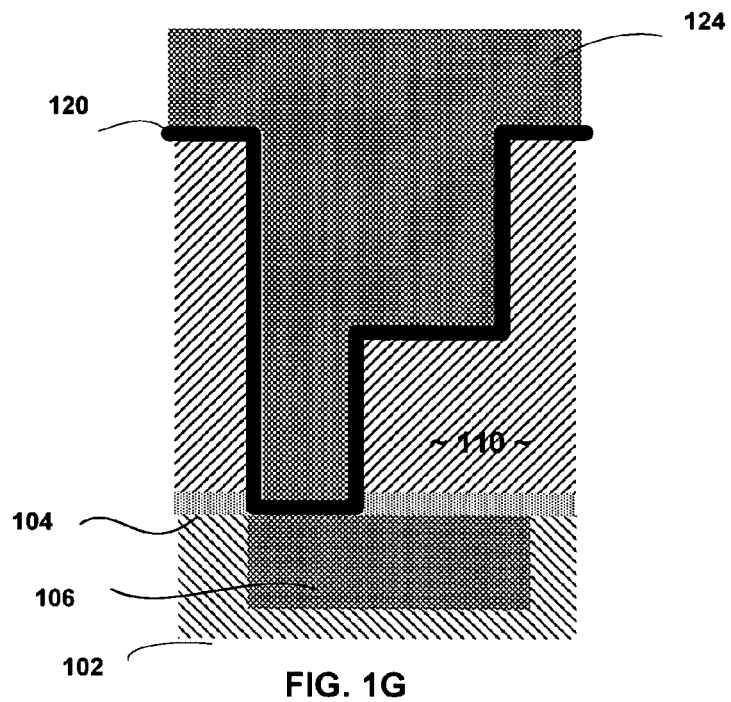
Figure 1H:
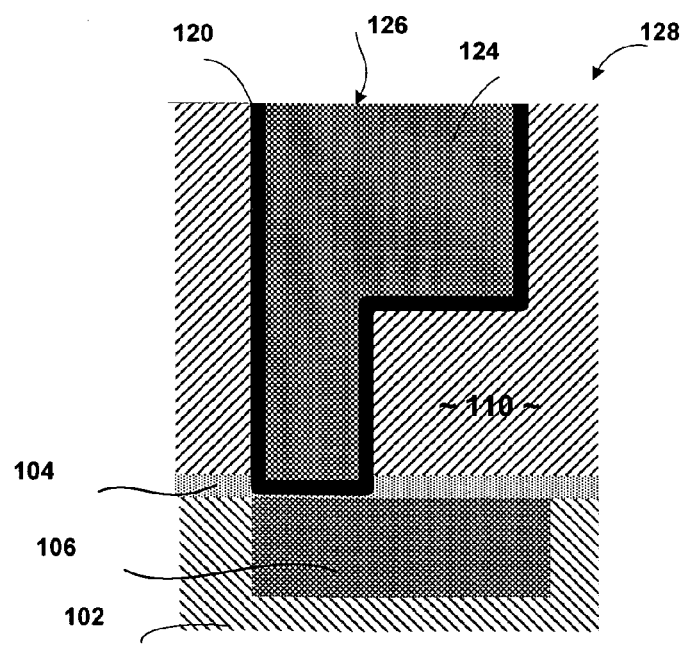
Figure 2A:
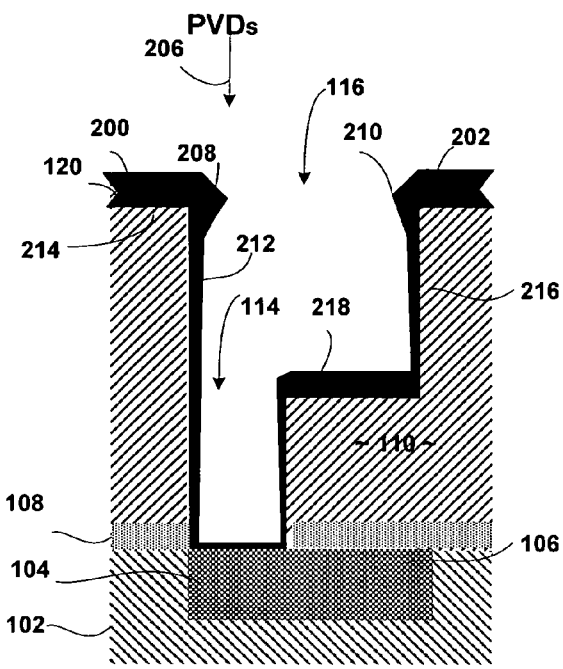
FIGS. 2A and 2B are cross sectional views comparing deposition of barrier material by PVD (FIG. 2A) with deposition by CVD or ALD (FIG. 2B)
Figure 2B:
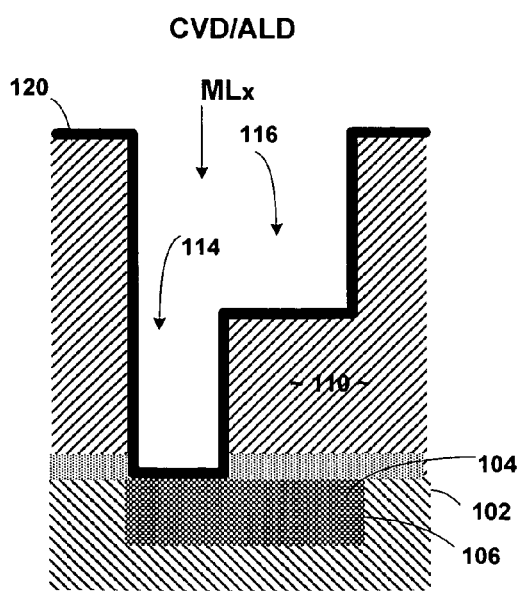
Figure 4:
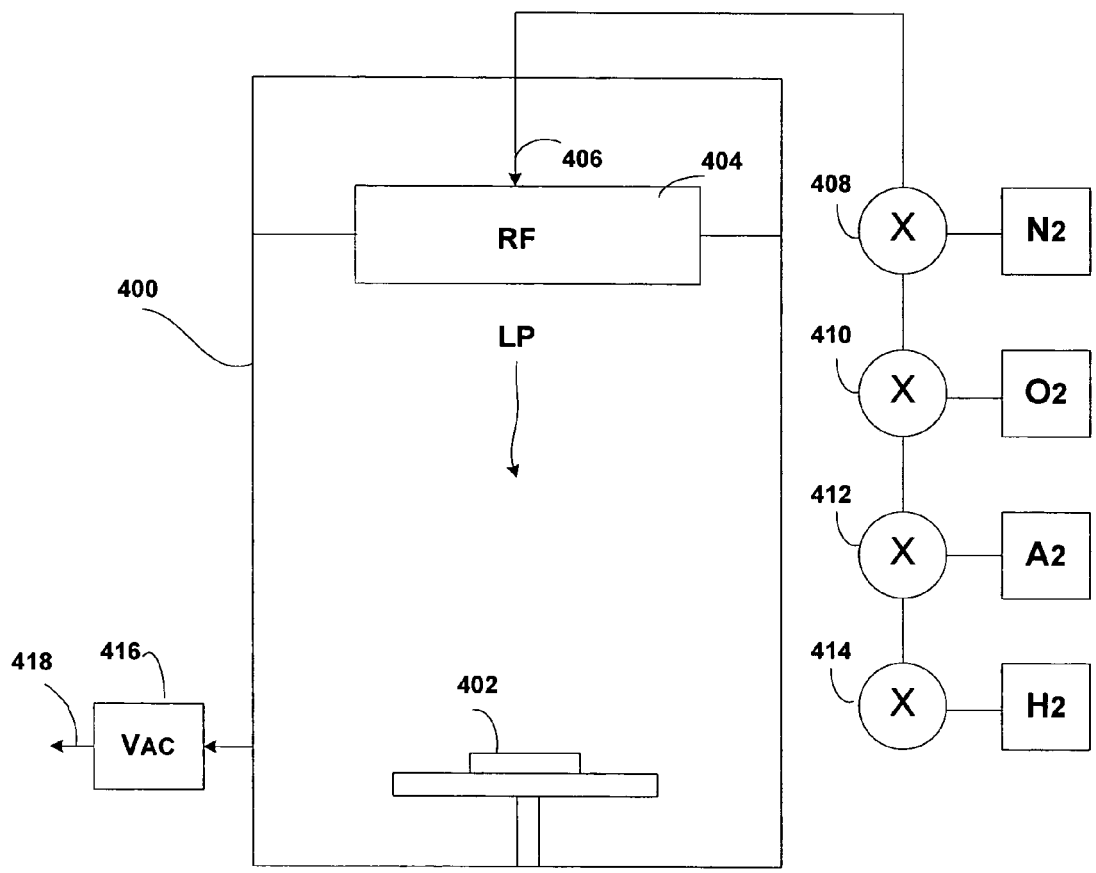
FIG. 4 shows a wafer under processing in a predeposition treatment chamber.

FIG. 4 shows a plasma treatment chamber 400 into which has been placed a wafer 402 that is being subjected to predeposition treatment by low power plasma LP. Wafer 402 may, for example, have been processed in the manner described in context of FIGS. 1A through 1D at the time wafer 402 is placed into the predeposition treatment chamber 400. A plasma treatment may, accordingly, precede deposition of barrier 120 by occurring between formation of the structure shown in FIG. 1D and formation of the barrier 120 shown in FIG. 1E. Low power plasma LP is formed by action of inductively coupled RF power 404 upon an inlet gas or gas mixture 406. The composition of inlet gas mixture 406 may vary according to a predetermined design, for example, where the total volume of the inlet gas mixture 406 contains single gasses or percentage mixtures of nitrogen ($N_2$), oxygen ($O_2$) argon (Ar), and/or hydrogen ($H_2$) as respectively governed by volumetric or mass flow controllers 408, 410, 412, 414. A vacuum source 416 maintains deposition pressure conditions within process design limits and withdraws outlet gas 418 from within predeposition process chamber 400. It will be appreciated that the plasma treatment chamber 400 may be modified to facilitate process automation and expedite wafer handling, for example, by robotic movements of wafer 402, the simultaneous processing of multiple wafers 402, or by including plasma treatment chamber 400 as one chamber in a series of processing chambers.

By way of illustration, FIGS. 5A, 5B and 5C show sequential steps in the formation of barrier 120 in a particular case where the plasma treatment chamber 400 uses low power plasma LP as a nitrogen-based plasma and the interlayer dielectric material 110 is silicon. Commencing with a region 306 as shown in FIG. 3B, except before introduction of MLx, the nitrogen based plasma LP commences striking region 306 as shown in FIG. 5A. FIG. 5B shows consequent reactive formation of silicon nitride interface material 500 generally coating the trench wall boundary 310 to seal pores 312, 314. The silicon nitride interface material 500 generally blocks permeation pathways 316, 318, 320 (see FIG. 3B) to prevent the permeation phenomenon. Plasma energy may cause localized material rearrangements to occur, such that a surface 502 between second dielectric layer 108 and interface material 500 is smoother and relatively closed to permeation-flow pathways, as compared to a relatively rougher surface 504 (FIG. 5A) that is more open to permeation flow. Thus, it is not necessary to have a reactive plasma where these rearrangements are alone sufficient to block or impede the permeation pathways 316, 318, 320 Surface 502 and interface 500 form barriers to permeation flow, but need not necessarily form complete or total barriers to permeation flow. Barrier 120 may next be deposited atop the silicon nitride interface without excessive permeation of MLx, as shown in FIG. 5C The barrier 120 may be formed by CVD or ALD processes without causing permeation damage.

The particular form of trench structure 114 is relatively unimportant to the broader principles of plasma predeposition treatment discussed herein. If not for this predeposition treatment, the trench 116 would be subject to the permeation phenomenon indicated for region 304 in FIGS. 3A and 3B. The low power plasma LP may differ from plasmas $P_1$, $P_2$, and $P_3$ in that LP has different composition, power, pressure, and lack of directionality. Use of the high power plasmas $P_1$, $P_2$, and $P_3$ in forming the via 114 and trench 116 of FIG. 1D may precede the use of low power plasma LP. Furthermore, the region 306 may be any surface forming part of the via 114 or trench 116.

FIGS. 6A to 6C show another plasma embodiment with sequential steps in the formation of barrier 120. In this in a particular case, the plasma treatment chamber 400 uses low power plasma LP as a mixture of oxygen and nitrogen-based plasma, and the interlayer dielectric material 110 is silicon. Commencing with a region 306 as shown in FIG. 3B, except before introduction of MLx, the plasma LP commences striking region 306 as shown in FIG. 6A. FIG. 6B shows consequent reactive formation of silicon nitride/silicon oxide interface material 600 generally coating the trench wall boundary 310 to seal pores 312, 314. The silicon nitride/silicon oxide interface material 600 generally blocks permeation pathways 316, 318, 320 (see FIG. 3B) to prevent the permeation phenomenon. Plasma energy may cause localized material rearrangements to occur, such that a surface 602 between second dielectric layer 108 and interface material 600 is smoother and relatively closed to permeation-flow pathways, as compared to a relatively rougher surface 604 (FIG. 5A) that is more open to permeation flow. Thus, it is not necessary to have a reactive plasma where these rearrangements are alone sufficient to block or impede the permeation pathways 316, 318, 320 Surface 502 and interface 500 form barriers to permeation flow, but need not necessarily form complete or total barriers to permeation flow. Barrier 120 may next be deposited atop the silicon nitride/silicon oxide interface without excessive permeation of MLx, as shown in FIG. 6C. The barrier 120 may be formed by CVD or ALD processes without causing permeation damage.

The nonlimiting examples that follow set forth preferred materials and methods for the predeposition treatment using low powered plasma $P_N$.

EXAMPLE 1

A plurality of silicon wafers were cleaned and prepared for deposition using a commercially available deposition system, namely the Inova™ system available from Novellus Systems, Inc. of San Jose, Calif. The Inova™ system was equipped with a precleaning chamber, namely, the Novellus Damaclean™ module. This module was used to perform the predeposition treatment by plasma LP, generally as shown in FIG. 4.

Prior to predeposition treatment using plasma LP, the silicon wafers received a 400 nm thick low k dielectric coating. The low k dielectric material was deposited and cured according to the manufacturer's instructions using a commercially available methyl silsesquioxane-based precursor, JSR LKD-5109™, which may be purchased from JSR of Sunnyvale, Calif. The deposited JSR material had a k value of 2.2, which is indicative of relatively high porosity compared to conventional oxide.

A control was established by depositing a 5 nm thick TiN barrier layer atop the JSR material using an argon plasma pretreatment with 750 W power cycling at 400 kHz applied to the Damaclean™ source under 200 W of pedestal bias power, directing plasma towards the substrate. Deposition of barrier material was by CVD using the TiN module that is provided as an integral part of the Inova™ system. The TiN deposition process used CVD including a reaction process conducted at 340° C. with reagents including tetrakis-di-ethyl-amido-titanium (TDEAT) and ammonia following the manufacturer's instructions. This type of low power plasma pretreatment might be used, for example, to clean the surface of a wafer prior to commencing deposition processes.

Subsequent wafers were subjected to alternative predeposition treatments under identical conditions to the control, except some process conditions were changed. Different power settings were used, though lower than 750 W, also cycling at 400 kHz. Also, the bias power was eliminated, the pedestal temperature during predeposition treatment was reduced to 50° C., and the plasma constituents were changed. The inlet gas constituents used to make the plasma were varied as: $N_2$ only, $Ar/N_2$, $Ar/N_2/H_2$, and $Ar/N_2/O_2$, as shown in Table 1.

Room temperature was used for the plasma predeposition treatments because polymeric/organic low k materials typically have a low thermal budget. No bias power was used because bias power increases ion energy and can more readily damage the fragile, porous low k materials. Lower source power ranging from less than 450 W to 600 W was used to prevent excessive damage to the fragile, porous low-k materials. Higher source power exceeding about 600 W results in energetic ion bombardment of the surface. The results obtained show that reactive plasma precleans, under controlled conditions, can reactively remove contamination left behind with etching and cleaning steps, but more importantly, react to densify or modify the surface to prevent precursor penetration. 750 W was the upper limit of the Damaclean™ module, but higher power settings are not desirable under pressure conditions ranging above 0.9 mTorr. The additional power above 750 W under these condition of pressure and nondirectional bias may also achieve pore-blocking, but is associated with a greater dielectric shift and increased damage to the fragile porous ILD. Running below 450 W is desirable at some pressures, but was not possible in a pressure range from 0.1 to 0.9 mTorr.

TABLE 1

CONDITONS FOR PORE-BLOCKING PREDEPOSITION PLASMA TREATMENT

| Plasma Conditions | Ar flow sccm | N2 flow sccm | H2 flow sccm | O2 flow sccm | Source Power W | Bias Power | Pressure mTorr | Pedestal Temp C. |
|---|---|---|---|---|---|---|---|---|
| BKM (Ar Only) | 20 | 0 | 0 | 0 | 750 | 200 | 0.9 | 350 C. |
| N2 Only | 0 | 20 | 0 | 0 | 500 | 0 | 0.7 | 50 C. |
| Ar/N2 | 5 | 20 | 0 | 0 | 600 | 0 | 0.7 | 50 C. |
| Ar/N2/H2 | 15 | 10 | 5 | 0 | 500 | 0 | 0.7 | 50 C. |
| Ar/N2/O2 | 5 | 20 | 0 | 5 | 450 | 0 | 0.9 | 50 C. |

Figure 7A:
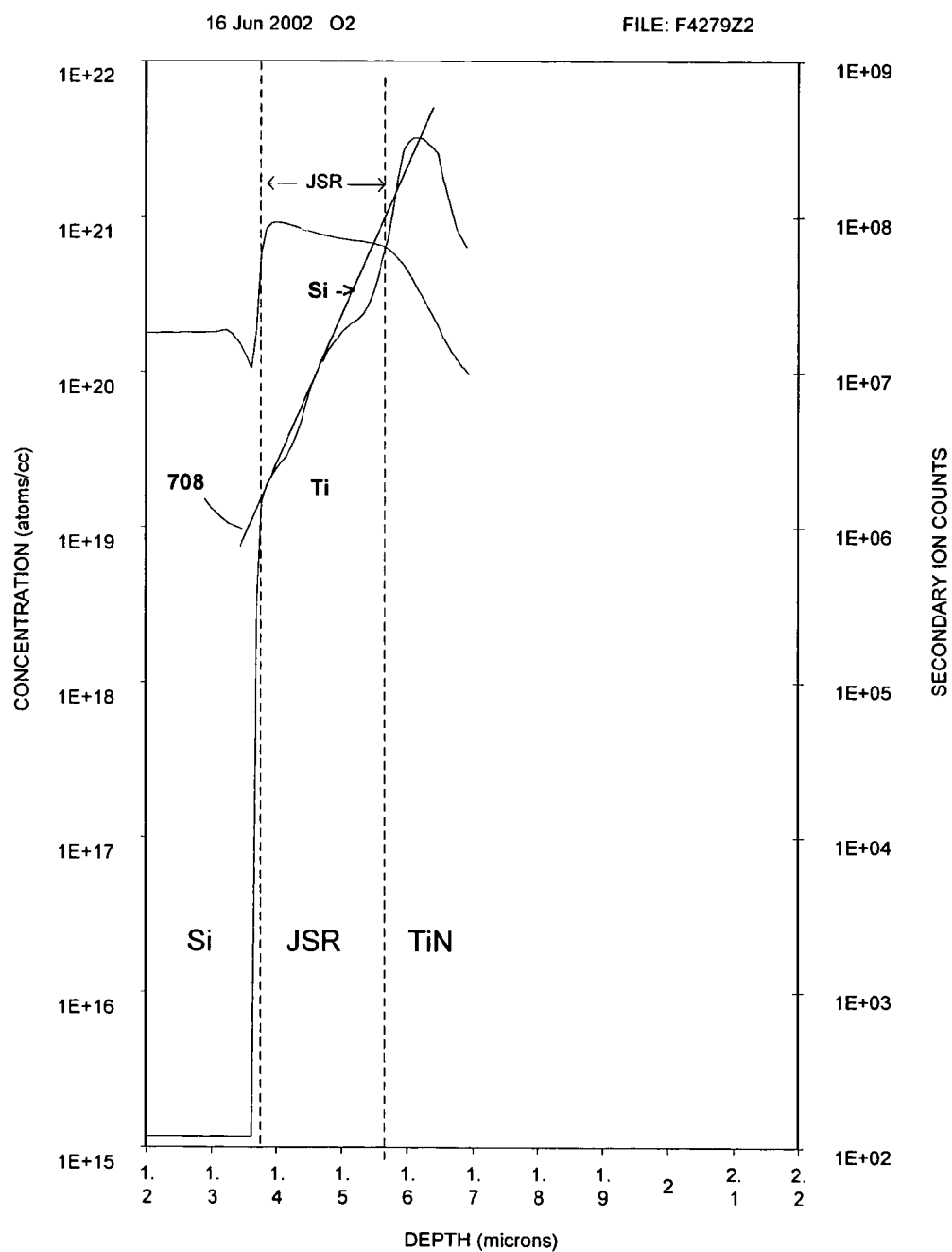
FIGS. 7A to 7E present SIMS measurements showing the depth profile of titanium penetration into a porous low k ILD material exposed to vapor of TDEAT after the surface of the ILD was treated with Ar plasma (FIG. 7A), $N_2$ plasma (FIG. 7B) Ar/$N_2$ plasma (FIG. 7C); Ar/$N_2$/$H_2$ plasma (FIG. 7D), and Ar/$N_2$/$O_2$ plasma (FIG. 7E).
Figure 7B:
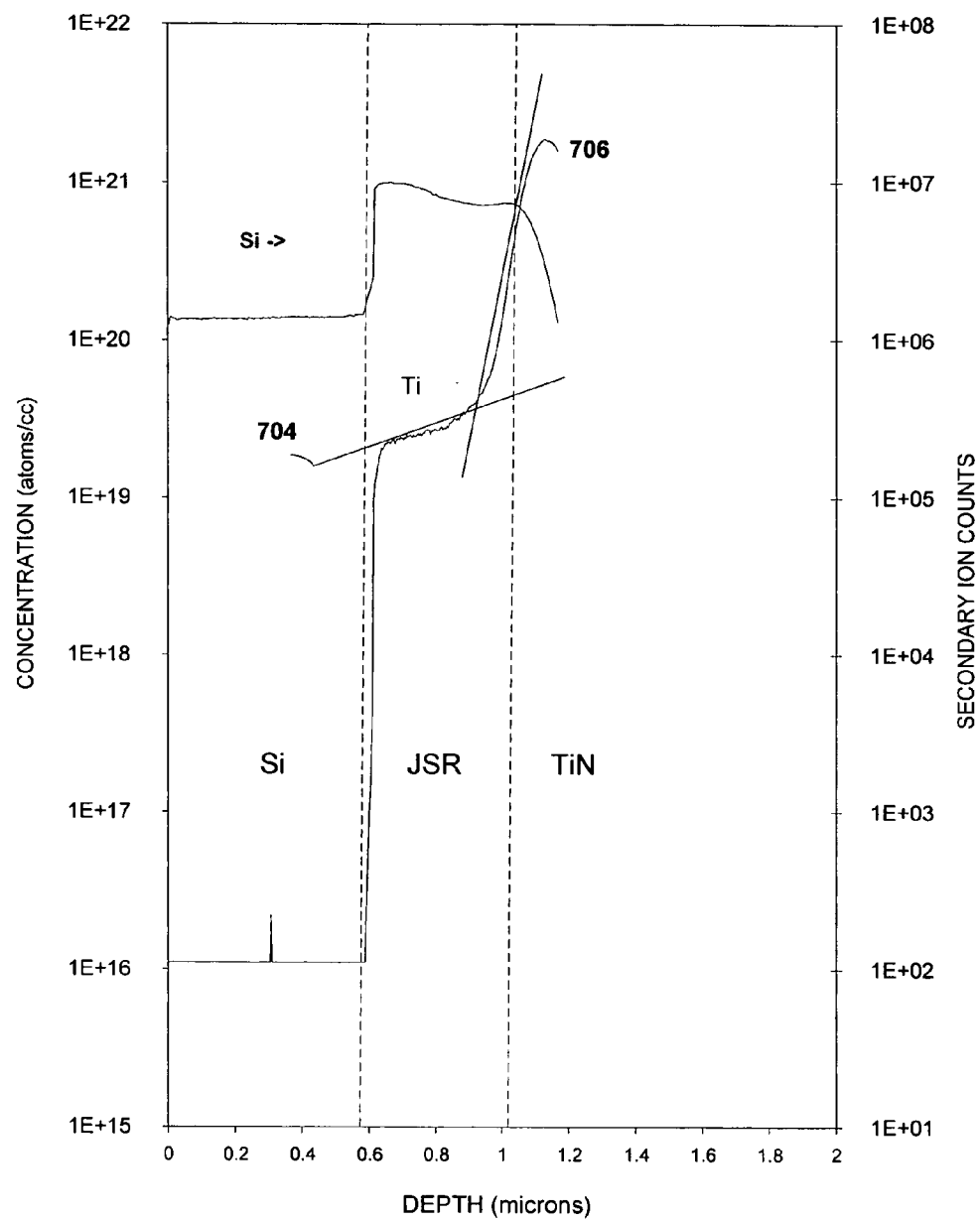
Figure 7C:
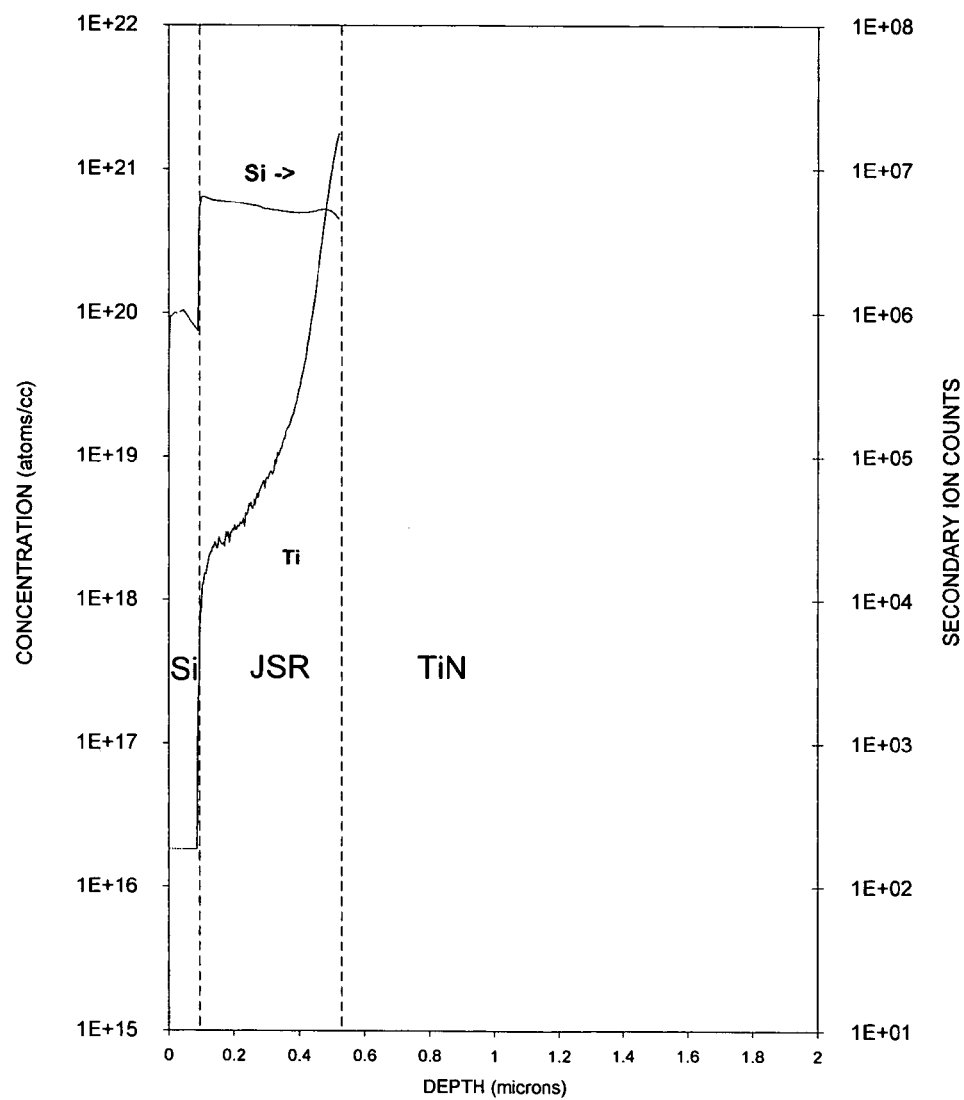

The wafers, having been subjected to the foregoing plasma predeposition treatments, received a 5 nm thick TiN barrier layer in an identical manner with respect to the control. All wafers were subjected to backside secondary ion mass spectroscopy (SIMS) measurements to assess the extent of titanium penetration into the ILD. These measurements assessed the elemental content at depth in the 400 nm layer of JSR material. The results are shown in FIGS. 7A through 7E, which represent various plasma pretreatments indicated in Table 1. FIG. 7A represents the Ar control BKM (Ar Only), FIG. 7B represents the $N_2$-only predeposition treatment, FIG. 7C represents the $Ar/N_2$ predeposition treatment, FIG. 7D the $Ar/N_2/H_2$ predeposition treatment, and FIG. 7E the $ArN_2/O_2$ predeposition treatment. In these figures, "Si" represents the wafer boundary, "JSR" represents the porous dielectric material deposited on the wafer, and "TiN" represents the titanium nitride barrier material deposited on the JSR. Vertically ascending lines, e.g., lines 700, 702, represent approximate physical boundaries of the respective Si, JSR, TiN layers prior to interlayer diffusion and/or permeation.

FIGS. 7A to 7E collectively show that low power nitrogen-based plasmas reduced the amount of titanium penetration into the JSR material by at least an order of magnitude compared to the argon only control, as determined by concentration at depth. By way of example, FIG. 7B shows Ti concentration of about $10^{19}$ atoms/cc in the JSR layer for the sample treated in $N_2$ plasma. This concentration at the interface is similar to that observed in the case of FIG. 7A for argon alone, but the slope 704 is much flatter and bifurcated into a steeper early slope 706, as compared to the more log-linear trend of slope 708 shown in FIG. 7A. Integration of total titanium content under the respective areas of the FIG. 7A and FIG. 7B titanium concentration curves shows that nitrogen-based predeposition treatment provided at least an order of magnitude reduction of titanium penetration into JSR, as determined by total titanium content per unit volume in JSR.

It is somewhat misleading that the SIMS results show Ti concentrations at the Si/JSR interface on the order of $10^{17}$ or $10^{19}$ atoms/cc. This is because ordinary JSR contains in-situ materials that read as Ti in SIMS measurements. Therefore, SIMS measurements were performed on a wafer that was coated with bare JSR to which no TDNEAT was applied. These SIMS results show that native JSR on the wafer contained abut $10^{15}$ Ti atoms/cc.

Figure 7D:
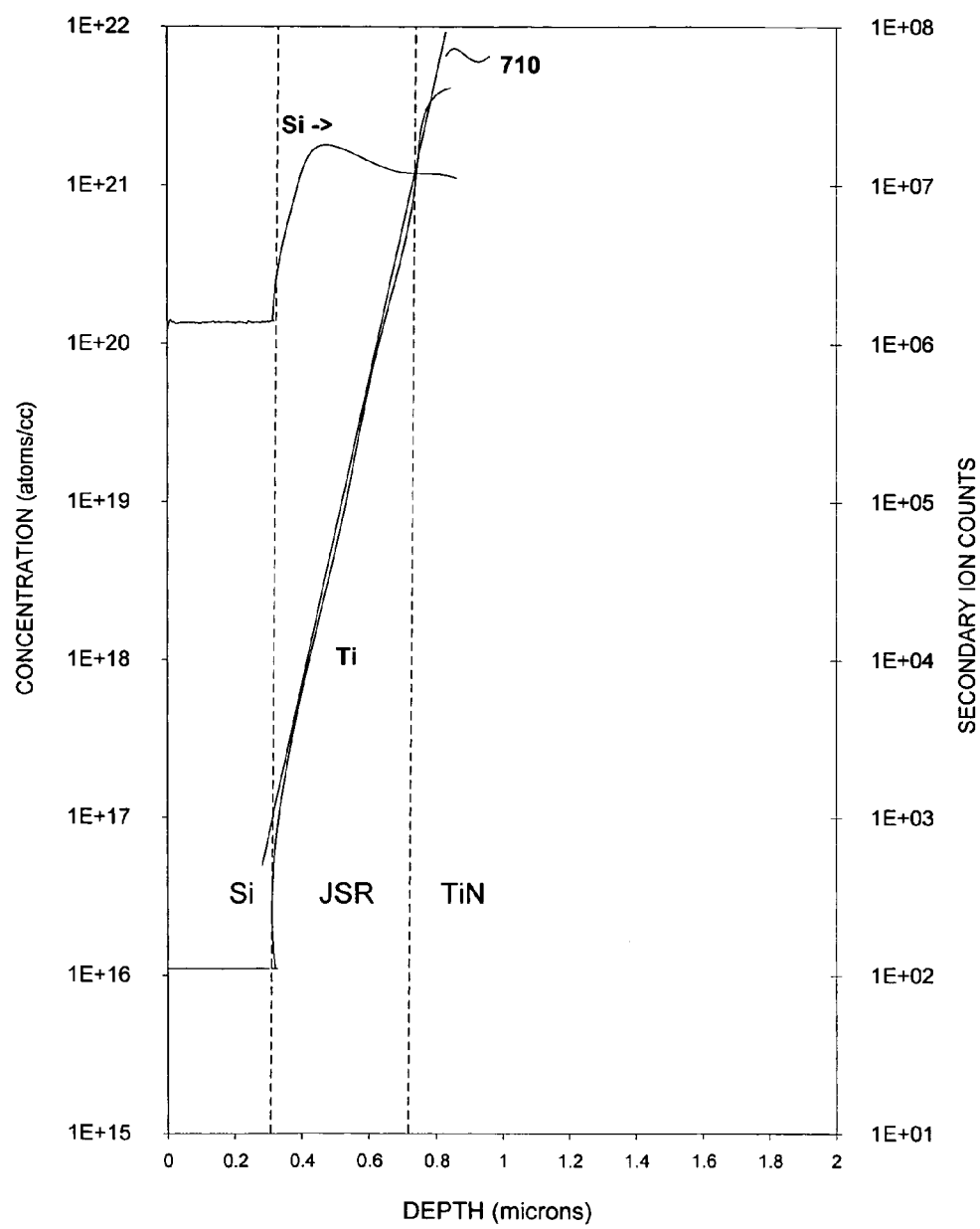
Figure 7E:
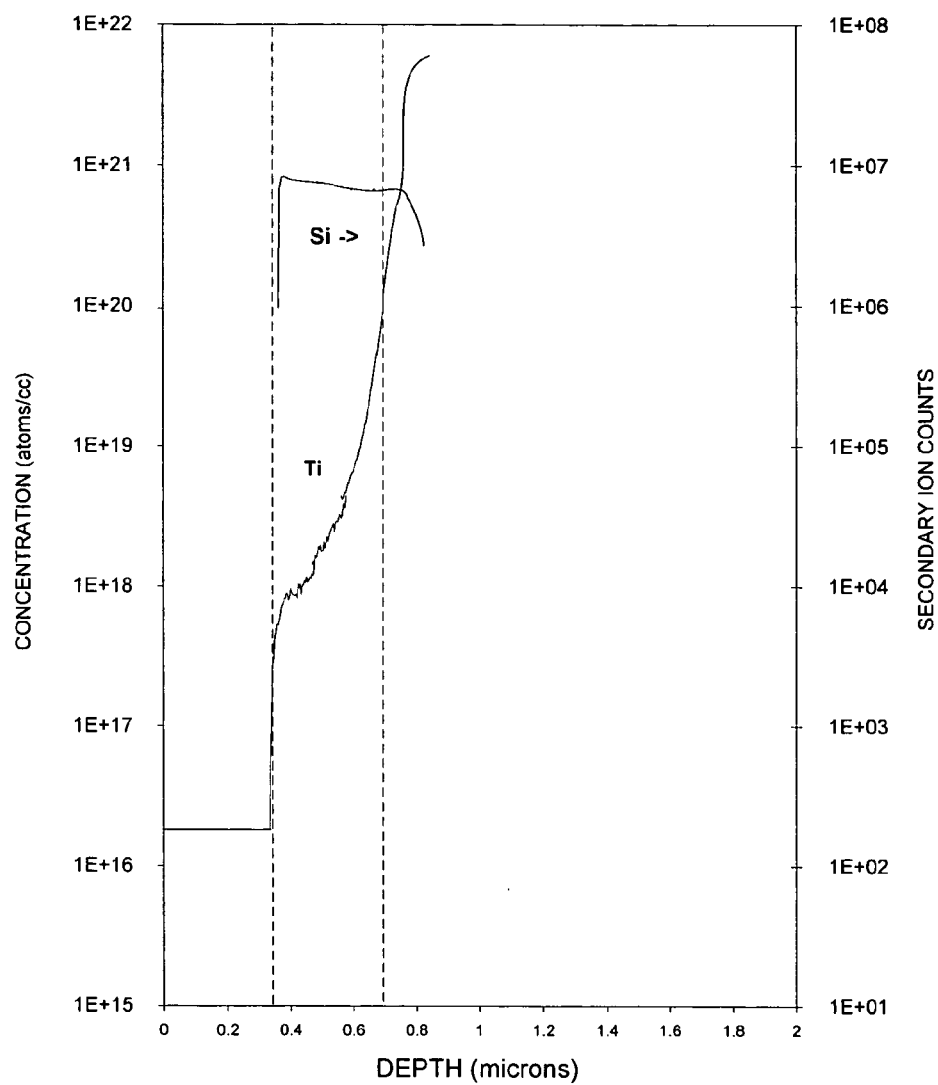

The FIG. 7C results show that use of the combined $N_2/O_2$ inlet gas mixture resulted in additional reductions of Ti content in JSR, and additionally decreased the Ti concentration at the JSR/Si interface. FIG. 7D shows that the $Ar/N_2/H_2$ treatment produced a linearly diminishing titanium concentration from TiN to JSR but also that the titanium curve has a steeper slope 710 than that of FIG. 7A—the SIMS results indicating about $10^{17}$ atoms/cc at the Si/JSR interface for FIG. 7D compared to $10^{19}$ in the case of FIG. 7A. FIG. 7E shows that the $Ar/N_2/O_2$ treatment provided a lower overall titanium content with a bifurcated slope of titanium concentration through the JSR, which slope is similar to but less abrupt in slope transition than the comparable results of FIG. 7B.

The SIMS data show that low power, non biased, nitrogen-based reactive plasma etching processes can be used as predeposition treatments that resist or prevent penetration from adjacently deposited barrier materials into an interlayer dielectric. Furthermore, while pure nitrogen plasmas have significant utility, additional constituents added to the nitrogen increase the resistance to penetration. By way of example, resistance is improved by adding Ar at a rate from 10% to 90% of the inlet gas mixture volume, or by adding hydrogen or oxygen at a rate from 2% to 33% of the inlet gas mixture volume. The additional constituents may either promote physical densification of the porous dielectrics (Ar) or chemical reactions leading to surface sealing ($O_2$, $H_2$).

Gains in preventing the penetration of barrier metal were somewhat offset by small increases, respectively, in the k values observed in the JSR materials. Table 2 shows percentage increases in the k values relative to the control wafer.

TABLE 2

PERCENTAGE INCREASE IN k OF JSR

| Predeposition Treatment | Percent Increase |
|---|---|
| $N_2$ | 0.6 |
| $Ar/N_2/H_2$ | 7.1 |
| $Ar/N_2/O_2$ | 9.7 |

The foregoing instrumentalities, as shown and described, teach by way of example, and not by limitation. It will be appreciated that changes may be made to the plasma constituents, power settings, temperature and pressure conditions according to the principles described herein, all with the effect of reducing barrier metal penetration into interlayer dielectrics. The processes heretofore described may be adapted for implementation on any variety of integrated circuit features and structures. Accordingly, the inventors state their intention to rely upon the doctrine of equivalents, if needed, to protect the scope and spirit hereof.

We claim:

1. A process for the prevention of precursor penetration in a porous dielectric material, comprising:
   forming a porous material on a substrate;
   etching a feature into the porous material, the feature presenting in-situ irregularities in the porous material;
   subjecting the feature to low power plasma exposure at a pressure of less than about 1 mTorr using plasma generated by RF power of 750 W or less, such conditions being sufficient to effectively diminish penetration of a precursor into the pores of dielectric material upon a subsequent diffusion barrier deposition step; and
   depositing a diffusion barrier onto the feature.

2. The process of claim 1, wherein the step of subjecting the feature to low power plasma exposure includes forming the plasma from a nitrogen-containing inlet gas mixture.

3. The process of claim 2, wherein the step of forming the nitrogen-containing gas includes mixing the nitrogen-containing gas mixture to include an additional constituent selected from the group consisting of argon, hydrogen, oxygen, and combinations thereof.

4. The process or claim 3, wherein the mixing step includes mixing the additional constituent to include argon ranging from 10% to 90% of the inlet gas mixture volume.

5. The process of claim 3, wherein the mixing step includes mixing the additional constituent to include hydrogen ranging from 2% to 33% of the inlet gas mixture volume.

6. The process of claim 3, wherein the mixing step includes mixing the additional constituent to include oxygen ranging from 10% to 90% of the inlet gas mixture volume.

7. The process of claim 3, wherein the mixing step includes mixing the additional constituent to include argon and hydrogen.

8. The process of claim 3, wherein the mixing step includes mixing the additional constituent to include argon and oxygen.

9. The process of claim 3, wherein the mixing step includes mixing the additional constituent to include oxygen and hydrogen.

10. The process of claim 1, wherein the step of subjecting the feature to low power plasma exposure includes forming the plasma from materials selected from the group consisting of nitrogen, hydrogen, oxygen, argon, and combinations thereof.

11. The process of claim 1 wherein the step of depositing a diffusion barrier comprises coating the feature with a metalorganic precursor capable of forming a barrier material.

12. The process of claim 11, wherein the barrier material comprises a metal nitride.

13. The process of claim 12, wherein the metal nitride is selected from the group consisting of titanium nitride, tantalum nitride, and tungsten nitride.

14. The process of claim 1, wherein the precursor used in the step of depositing a diffusion barrier comprises a transition metal.

15. The process of claim 1, where the precursor used in the step of depositing a diffusion barrier comprises a metal from the group consisting of titanium, tantalum and tungsten.

16. The process of claim 1, wherein the step of subjecting the feature to low power plasma exposure does not include creating a field to bias the low-power plasma towards the feature.

17. The process of claim 1, wherein the porous dielectric material comprises a low-k dielectric.

18. The process of claim 1, wherein the step of depositing the diffusion barrier includes vaporizing a metalorganic precursor.

19. A semiconductor device produced by a process according to claim 1.

* * * * *